United States Patent
Do

(10) Patent No.: US 7,283,412 B2
(45) Date of Patent: Oct. 16, 2007

(54) BIT LINE SENSE AMPLIFIER AND SEMICONDUCTOR MEMORY DEVICE HAVING THE SAME

(75) Inventor: Chang-Ho Do, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 11/030,614

(22) Filed: Jan. 5, 2005

(65) Prior Publication Data

US 2006/0023534 A1 Feb. 2, 2006

(30) Foreign Application Priority Data

Jul. 27, 2004 (KR) ...................... 10-2004-0058865

(51) Int. Cl.
*G11C 7/00* (2006.01)
(52) U.S. Cl. ...................... 365/205; 365/207; 365/190
(58) Field of Classification Search ................ 365/205, 365/207
See application file for complete search history.

(56) References Cited

U.S. PATENT DOCUMENTS

| | | | |
|---|---|---|---|
| 5,835,436 A * | 11/1998 | Ooishi ................... | 365/230.03 |
| 5,920,517 A | 7/1999 | Wendell | |
| 5,923,601 A | 7/1999 | Wendell | |
| 5,936,892 A | 8/1999 | Wendell | |
| 5,936,898 A * | 8/1999 | Chi ........................... | 365/190 |
| 6,061,278 A * | 5/2000 | Kato et al. ................... | 365/190 |
| 6,104,653 A * | 8/2000 | Proebsting ................... | 365/203 |
| 6,141,259 A * | 10/2000 | Scott et al. ............ | 365/189.06 |
| 6,288,950 B1 | 9/2001 | Koike | |
| 6,480,434 B1 * | 11/2002 | Lee ........................... | 365/203 |
| 6,515,927 B2 * | 2/2003 | Kitamoto et al. ........... | 365/205 |
| 6,930,938 B2 * | 8/2005 | Yasuda ....................... | 365/201 |
| 2004/0105334 A1 | 6/2004 | Yasuda | |
| 2004/0136251 A1 * | 7/2004 | Mizuno et al. ............. | 365/203 |
| 2005/0002245 A1 | 1/2005 | Brede et al. | |

FOREIGN PATENT DOCUMENTS

| | | |
|---|---|---|
| JP | 11-149796 | 6/1999 |
| JP | 2001-229671 | 8/2001 |
| KR | 2001-0004688 | 1/2001 |
| KR | 1020030057273 A | 7/2003 |

* cited by examiner

*Primary Examiner*—Thong Q. Le
(74) *Attorney, Agent, or Firm*—Blakely Sokoloff Taylor & Zafman

(57) ABSTRACT

There is provided a semiconductor memory device that can calculate an offset voltage of a bit line sense amplifier. The semiconductor memory device includes a cell array, an edge bit line sense amplifier for amplifying data of an edge cell array, and a power supply part for applying a predetermined voltage to the edge bit line sense amplifier. The power supply part includes a first power supply part for supplying a predetermined voltage to a bit line of the edge bit line sense amplifier and a second power supply part for supplying a predetermined voltage to a complementary bit line of the edge bit line sense amplifier.

19 Claims, 13 Drawing Sheets

BIT LINE SENSE AMPLIFIER AND SEMICONDUCTOR MEMORY DEVICE HAVING THE SAME

FIELD OF INVENTION

The present invention relates to a semiconductor memory device; and, more particularly, to a semiconductor memory device which can simply measure an offset voltage of a sense amplifier.

DESCRIPTION OF PRIOR ART

A semiconductor memory device, especially a dynamic random access memory (DRAM), must amplify a data of a very low energy in order to read a bit data from a memory cell. At this point, a bit line sense amplifier (BLSA) is used.

A bit line sense amplifier has an offset voltage due to difference in threshold voltages, transconductance and capacitance of MOS devices. A voltage difference of a cell data applied on bit lines is very slight. Therefore, if an offset voltage of the sense amplifier is large, the sense amplifier cannot stably perform an amplifying operation. Thus, the offset voltage of the sense amplifier must be measured in order for the stable operation of the semiconductor memory device.

According to the prior art, in order to measure the offset voltage of the sense amplifier, a bias voltage (that is, a voltage of cell plate (VCP)) of an electrode disposed opposite to a cell storage node is varied and then a data is read. In this manner, an occurrence of an error is determined and the offset voltage is measured by applying a theoretical equation.

It is difficult to accurately measure the cell capacitance and bit line capacitances and thus the offset voltage of the bit line sense amplifier cannot be measured accurately.

SUMMARY OF INVENTION

It is, therefore, an object of the present invention to provide a semiconductor memory device that can measure an offset voltage of a bit line sense amplifier.

It is another object of the present invention to provide a semiconductor memory device that can measure an offset voltage by directly applying a test voltage to an input line of a bit line sense amplifier.

In accordance with an aspect of the present invention, there is provided a bit line sense amplifier for amplifying a voltage difference between a bit line and a complementary bit line on which data of a memory cell is applied in a data read operation. The bit line sense amplifier includes: a first power supply part for generating a first voltage to be applied to the bit line; a second power supply part for generating a second voltage to be applied to the complementary bit line; a first power supply switch for switching the first power supply part and the bit line; and a second power supply switch for switching the second power supply part and the complementary bit line.

In another aspect of the present invention, there is provided a semiconductor memory device including: a cell array; an edge bit line sense amplifier for amplifying data of an edge cell array; and a power supply part for applying a predetermined voltage to the edge bit line sense amplifier.

In a further another aspect of the present invention, there is provided a semiconductor memory device including: a cell array; an edge bit line sense amplifier for amplifying data of some cell columns among edge cell arrays; a semi-edge bit line sense amplifier for amplifying data of other cell columns among the edge cell arrays; a power supply part for supplying a voltage to the edge bit line sense amplifier; and a voltage transfer part for transferring the voltage to the semi-edge bit line sense amplifier.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor device in accordance with the present invention will be described in detail referring to the accompanying drawings.

EMBODIMENT 1

Figure 1:
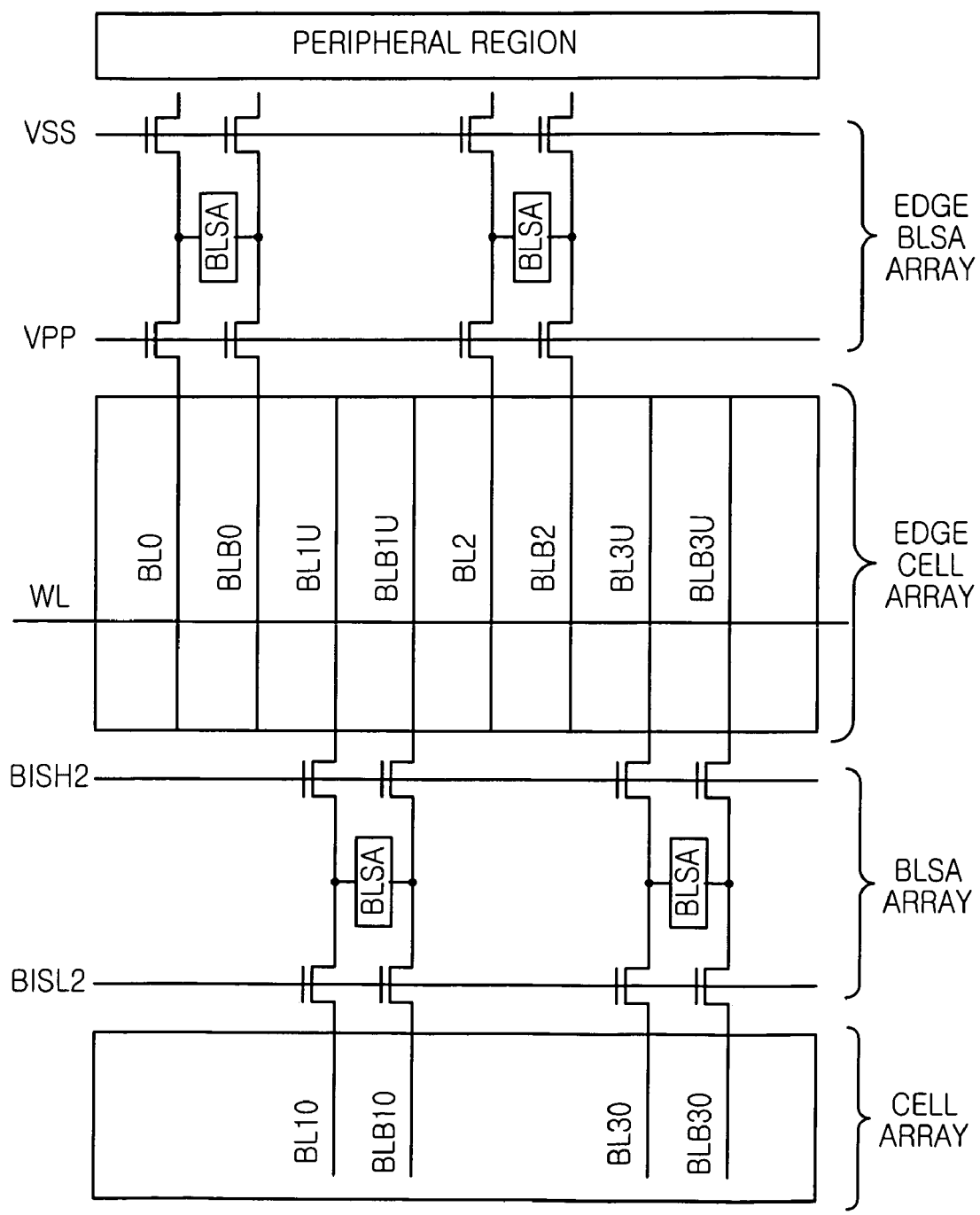
FIG. 1 is a diagram illustrating a bit line sense amplifier array and a cell array of a conventional semiconductor memory device.

FIG. 1 is a block diagram showing a structure of a general semiconductor memory device.

In general, a cell area of the semiconductor memory device is generally divided into a plurality of cell array blocks.

Referring to FIG. 1, each of the cell array blocks includes a plurality of cell arrays, bit line sense amplifiers (BLSAs) disposed between the cell arrays, and edge BLSA arrays disposed at upper and lower edges. One cell array includes a plurality of cell columns, each of which includes memory cells sharing a bit line pair. Also, one bit line sense amplifier array includes a plurality of bit line sense amplifiers.

A structure that one bit line sense amplifier array manages the upper and lower cell arrays is called a "shared sense amplifier structure". In the shared sense amplifier structure, one bit line sense amplifier is connected to a bit line pair (an upper bit line pair) of a cell column contained in an upper cell array through an upper bit line select switch, and also it is connected to a bit line pair (a lower bit line pair) of a cell column contained in a lower cell array through a lower bit line select switch.

Meanwhile, in the semiconductor memory device of the conventional shared sense amplifier structure, one edge bit line sense amplifier can be connected to only one cell column disposed at one upper or lower cell column. However, in case where its structure is different from that of other bit line sense amplifier, performance may be different so that it is not suitable. Accordingly, an upper bit line switch and a lower bit line switch are provided for the edge bit line sense amplifier. Then, a turn-on voltage (VPP) is always applied to the switches connected to the cell column among the upper or lower bit line sense amplifier, and a turn-off voltage (VSS) is always applied to the other switches.

Figure 2:
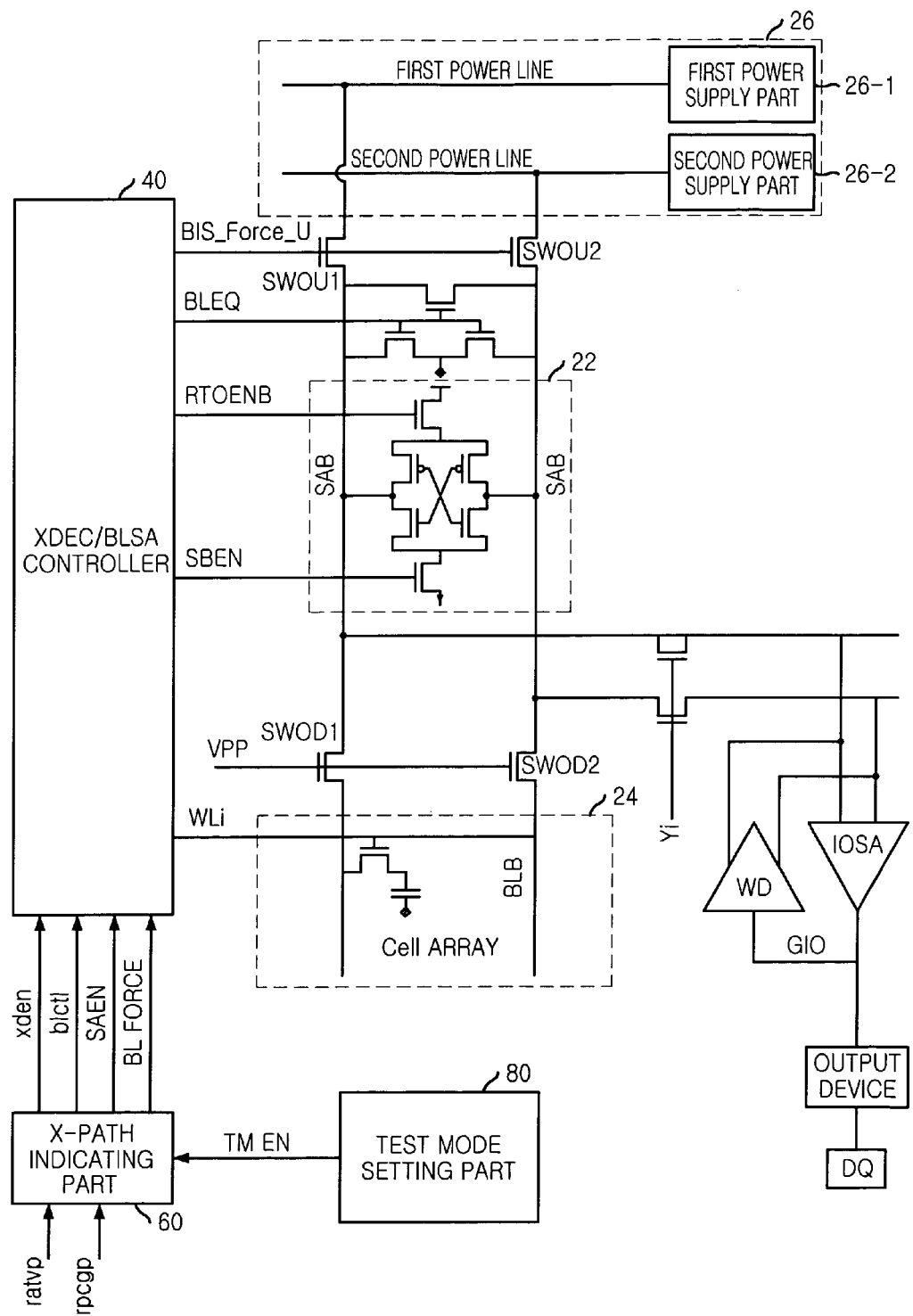
FIG. 2 is a circuit diagram illustrating a semiconductor memory device having an edge bit line sense amplifier in accordance with a first embodiment of the present invention.
Figure 3:
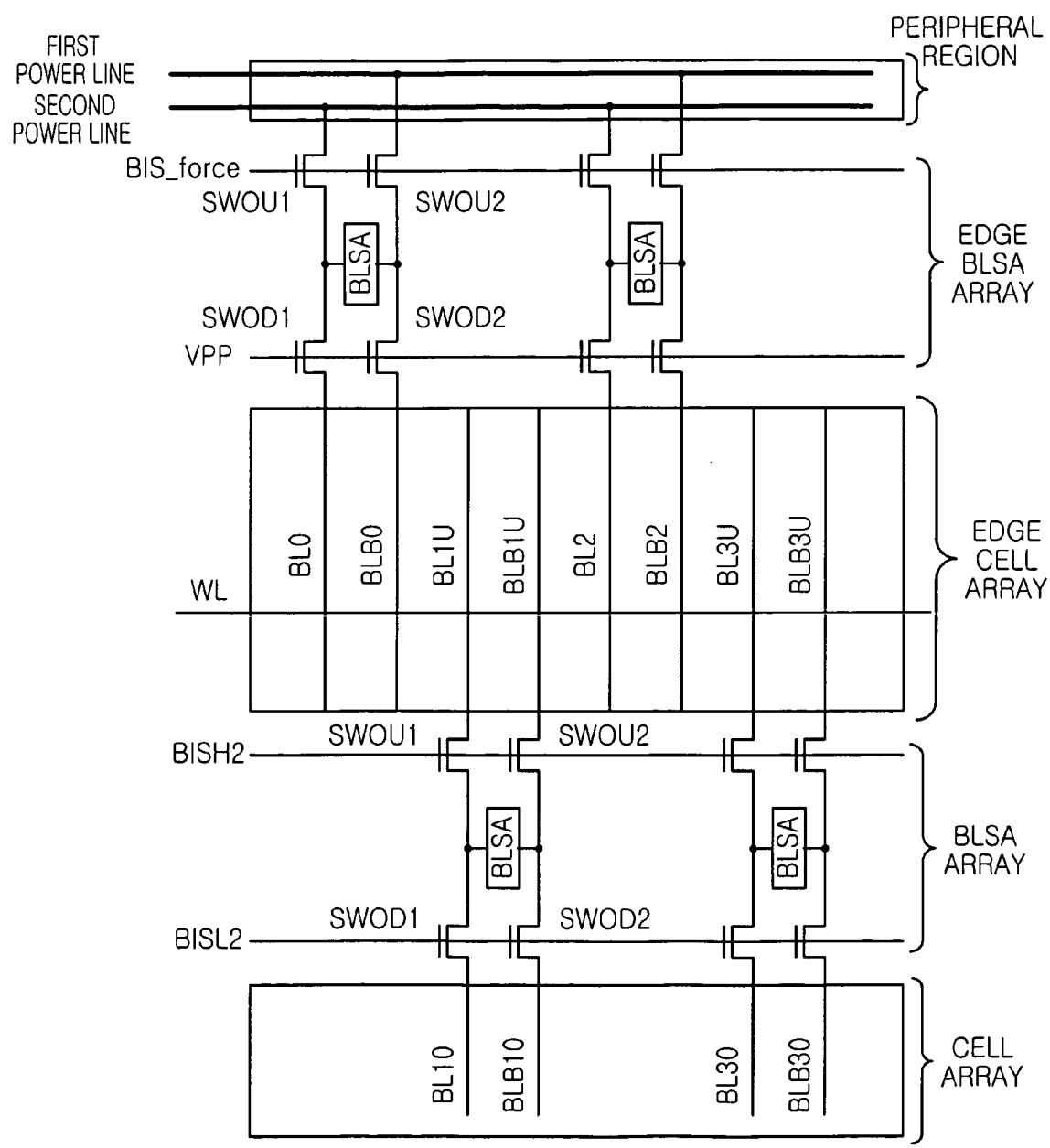
FIG. 3 is a diagram illustrating a bit line sense amplifier array and a cell array of the semiconductor memory device in accordance with the first embodiment of the present invention.

The present invention is applied to a DRAM having the shared sense amplifier structure. Referring to FIGS. 2 and 3, the semiconductor memory device in accordance with the present invention includes a plurality of cell arrays, an edge bit line sense amplifier 22 for amplifying data of an edge cell array 24, and a power supply part 26 for supplying a voltage to the edge bit line sense amplifier 22.

The power supply part 26 includes a first power supply part 26-1 for supplying a voltage to a bit line of the edge bit line sense amplifier 22, and a second power supply part 26-2 for supplying a voltage to a complementary bit line of the edge bit line sense amplifier 22.

In addition, the semiconductor memory device includes an X-decoder/amplifier controller 40 for selecting a cell and controlling a sense amplifier array, and a test mode setting part 80 for outputting a test mode enable signal TM_EN for an offset voltage test mode of the sense amplifier. The semiconductor memory device may further include an X-path indicating part 60 for receiving a row active command ratvp, a precharge command rpcgp and a test enable signal TM_EN to generate a reference signal for an operation of the X-decoder/amplifier controller 40.

Like the general bit line sense amplifier, upper bit line select switches SWOU1 and SWOU2 are connected to the upper bit line pair and lower bit line select signal switches SWOD1 and SWOD2 are connected to the lower bit line pair. In this embodiment, the edge bit line sense amplifier is connected to the lower cell column through the lower bit line select switches SWOD1 and SWOD2 and is connected to the power supply through the upper bit line select switches SWOU1 and SWOU2. In view of the extern power supply, the upper bit line select switches SWOU1 and SWOU2 are provided with the first power supply switch SWOU1 for connecting the bit line of the edge bit line sense amplifier 22 to the first power supply part 26-1, and the second power supply switch SWOU2 for connecting the complementary bit line of the edge bit line sense amplifier to the second power supply part 26-2.

The first power supply part 26-1 and the second power supply part 26-2 can be separately implemented with a test voltage generator within the DRAM. Also, it is preferable that the test voltage is separately supplied from an exterior of the DRAM and then the sense amplifier offset test is performed. For theses reasons, it is preferable that the first power supply part 26-1 and the second power supply 26-2 part are implemented with external connection pads for merely receiving the voltage from the external of the DRAM.

Referring to FIGS. 2 and 4A to 4D, the X-path indicating part 60 includes a timing controller 62, an X-decoder enable signal generator 64, a block control signal generator 66, and bit line sensing controller 68 and 69.

The timing controller 62 determines an activation timing of signals so as to secure a stable amplification operation of the cell. The X-decoder enable signal generator 64 generates a X-decoder enable signal XDEN for controlling an activation timing of the X-decoder. The block control signal generator 66 generates a block control signal blctl for controlling an activation timing of a corresponding cell array block. The bit line sensing controllers 68 and 69 control the switching operation of the bit line select switches and the amplification operation of the bit line sense amplifier so as to supply a voltage to the edge bit line sense amplifier through a power line.

Figure 4A:
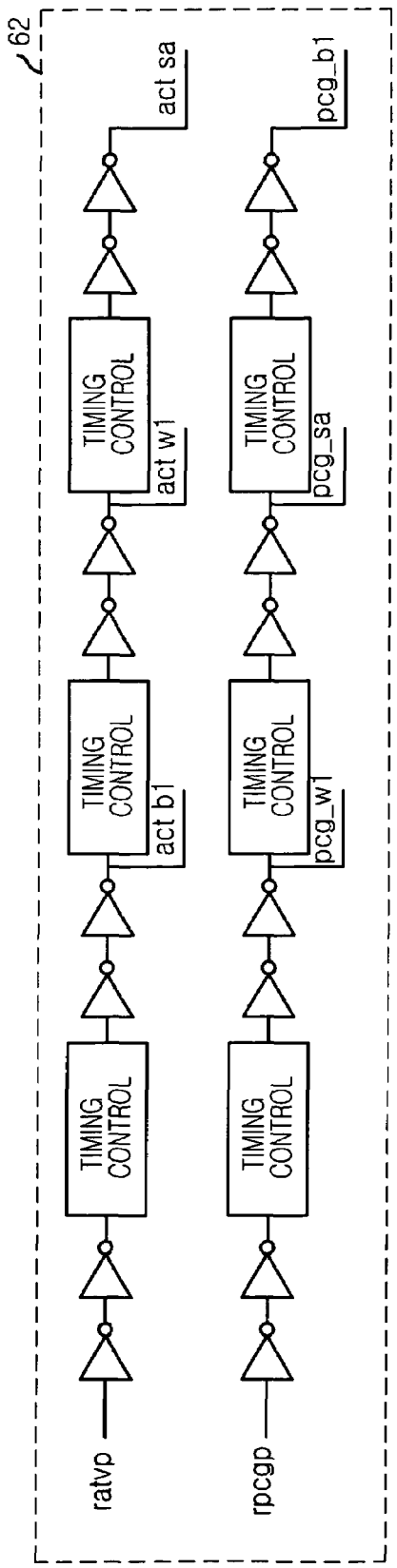
FIG. 4A is a circuit diagram illustrating an edge bit line sense amplifier controller of the semiconductor memory device in accordance with the first embodiment of the present invention.
Figure 4B:
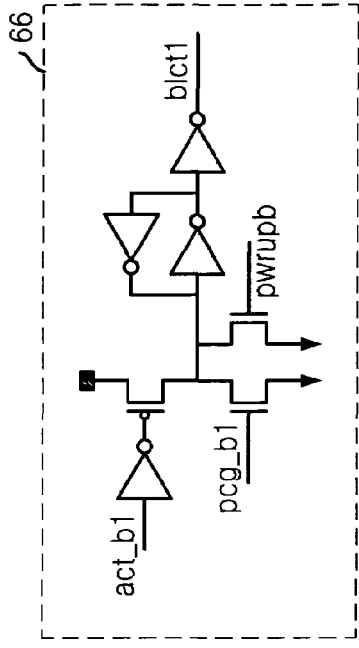
FIG. 4B is a circuit diagram illustrating a block control signal generator of the semiconductor memory device in accordance with the first embodiment of the present invention.
Figure 4C:
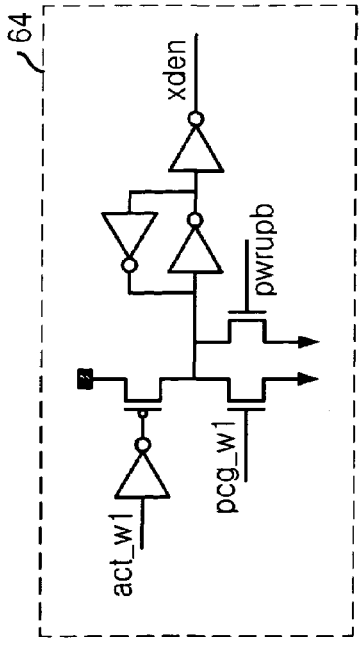
FIG. 4C is a circuit diagram illustrating an X-decoder enable signal generator of the semiconductor memory device in accordance with the first embodiment of the present invention.

In FIGS. 4A to 4C, the timing controller 62, the X-decoder enable signal generator 64 and the block control signal generator 66 are exemplarily shown. The three elements receive the row active command ratvp and the precharge command rpcgp for the cell array block, delay/maintain the commands by a predetermined time based on a regulation of logic devices for the stable operation of the cell core, and output the X-decoder enable signal XDEN and the block control signal blctl.

The bit line sensing controllers 68 and 69 can be implemented in various manners. In this embodiment, two structures shown in FIGS. 4D and 4E will be described below.

Figure 4D:
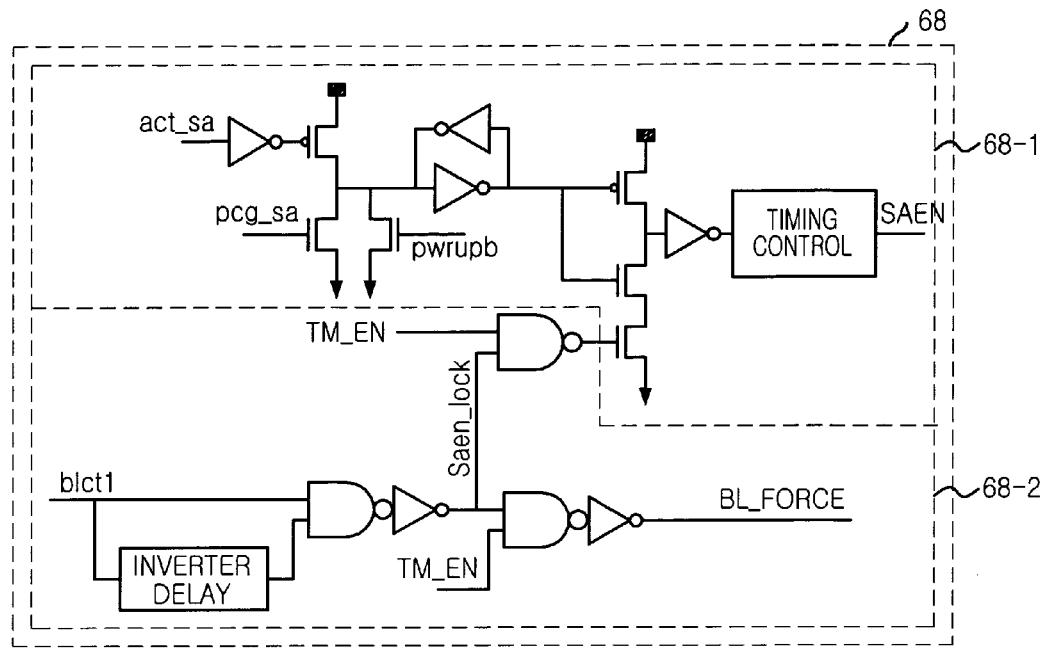
FIG. 4D is a circuit diagram illustrating a bit line sensing controller of the semiconductor memory device in accordance with the first embodiment of the present invention.

Referring to FIG. 4D, the bit line sensing controller 68 includes a command processing module 68-1 and a test processing module 68-2. The command processing module 68-1 receives the active/precharge commands for the sense amplifier and generates a sense amplifier enable signal SAEN. The test processing module 68-2 deactivates the command processing module 68-1 in a test mode and generates the block control signal blctl that is enabled for a predetermined time.

The bit line sensing controller 68 is controlled in response to the test mode enable signal TM_EN in the test mode and generates a bit line force signal BL_FORCE that is activated from the enabling timing of the block control signal blctl for a predetermined time. Also, the bit line sensing controller 68 disables the output of the sense amplifier enable signal SAEN during the activation of the bit line force signal BL_FORCE. The bit line force signal BL_FORCE controls the first power supply switch and the second power supply switch (bit line select switches) to supply the voltage as the input signal of the edge sense amplifier through the power line.

Figure 10:
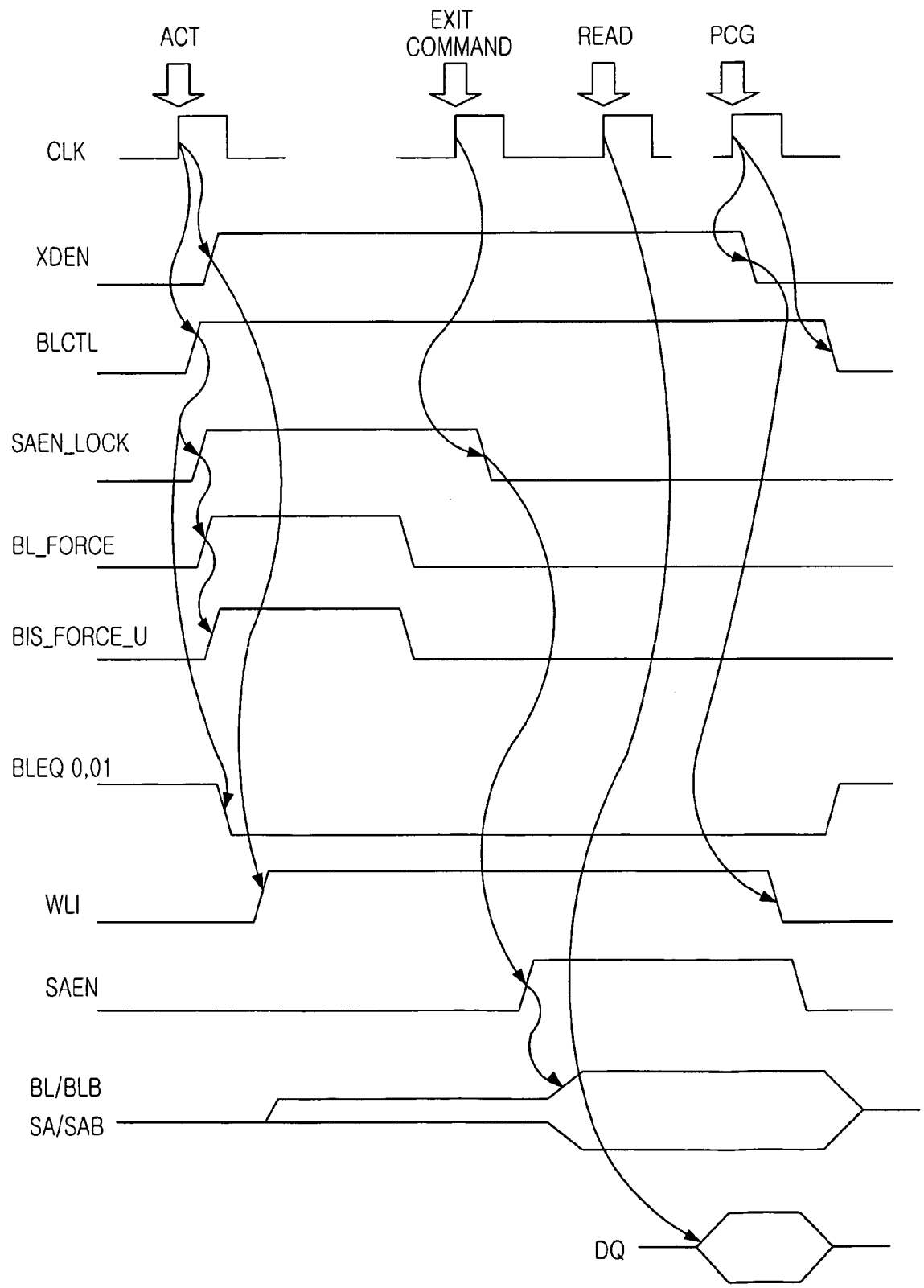
FIG. 10 is a signal timing diagram of the semiconductor memory device having the bit line sensing controller of FIG. 4E in accordance with the first embodiment of the present invention.
Figure 11:
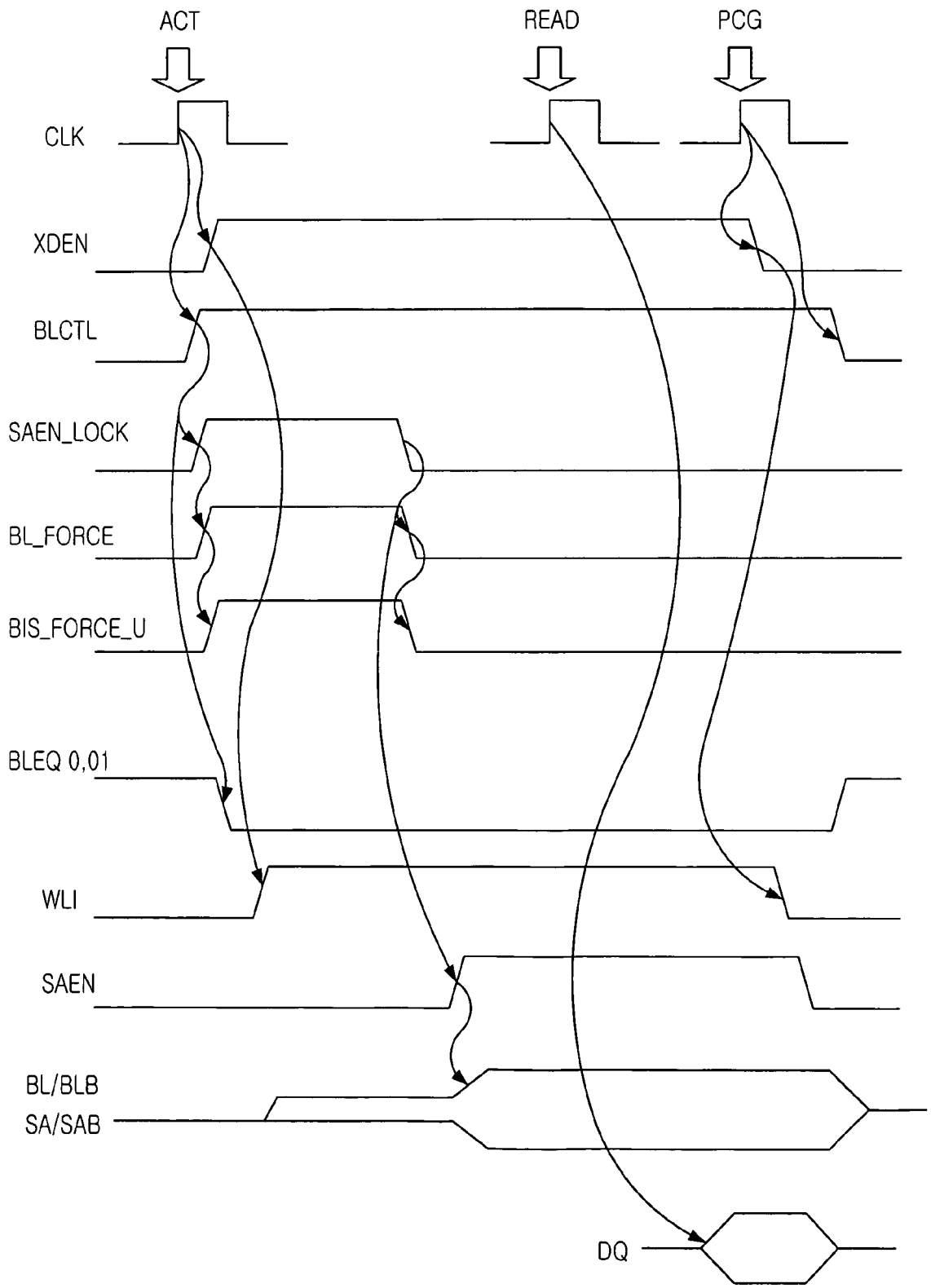
FIG. 11 is a signal timing diagram of the semiconductor memory device having the bit line sensing controller of FIG. 4D in accordance with the second embodiment of the present invention.

An operation timing diagram of the bit line sensing controller shown in FIG. 4D is shown in FIG. 10.

First, in a normal operation where the test mode enable signal TM_EN is not activated, if the sense amplifier active signal act_sa set by the timing controller 62 is enabled, the sense amplifier enable signal SAEN is activated after a predetermined time and the bit line force signal BL_FORCE maintains a low level during the normal operation, so that the first power supply switch SWOU1 and the second power supply switch SWOU2 are turned off.

If the test mode is set for measuring the offset voltage of the edge bit line sense amplifier 22 by the test mode setting part 80, the test mode enable signal $TM_{13}EN$ is activated to a high level. Then, if the bit line force signal $BL_{13}FORCE$ maintaining a low level is set to a high level along the row active command ratvp, a sense amplifier lock signal is set to a high level. After the bit line force signal $BL_{13}FORCE$ is activated to a high level, the sense amplifier lock signal $saen_{13}lock$ is set to a low level after a predetermined delay of an inverter delay configured with a resistor, a capacitor and an odd number of inverters. Then, the bit line force signal $BL_{13}FORCE$ is also set to a low level. The sense amplifier enable signal SAEN is activated to a high level after a predetermined delay. The edge sense amplifier controller controls the first power supply switches SWOU1 and SWOU2 according to the timing of the bit line force signal $BL_{13}FORCE$ and the sense amplifier enable signal SAEN.

Figure 4E:
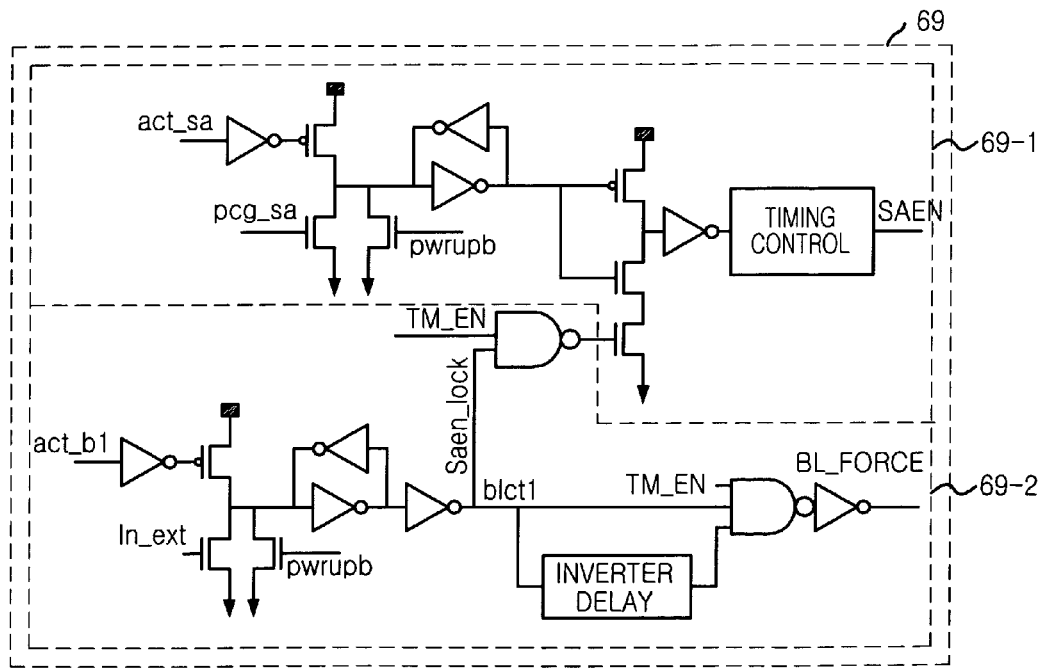
FIG. 4E is a circuit diagram illustrating a bit line sensing controller of the semiconductor memory device in accordance with the first embodiment of the present invention.

Referring to FIG. 4E, the bit line sensing controller 69 includes a command processing module 69-1 and a test processing module 69-2. The command processing module 69-1 receives the active/precharge commands for the sense amplifier and generates a sense amplifier enable signal SAEN. The test processing module 69-2 deactivates the command processing module 68-1 in a test mode and generates the block control signal blctl that is enabled for a predetermined time.

Figure 12:
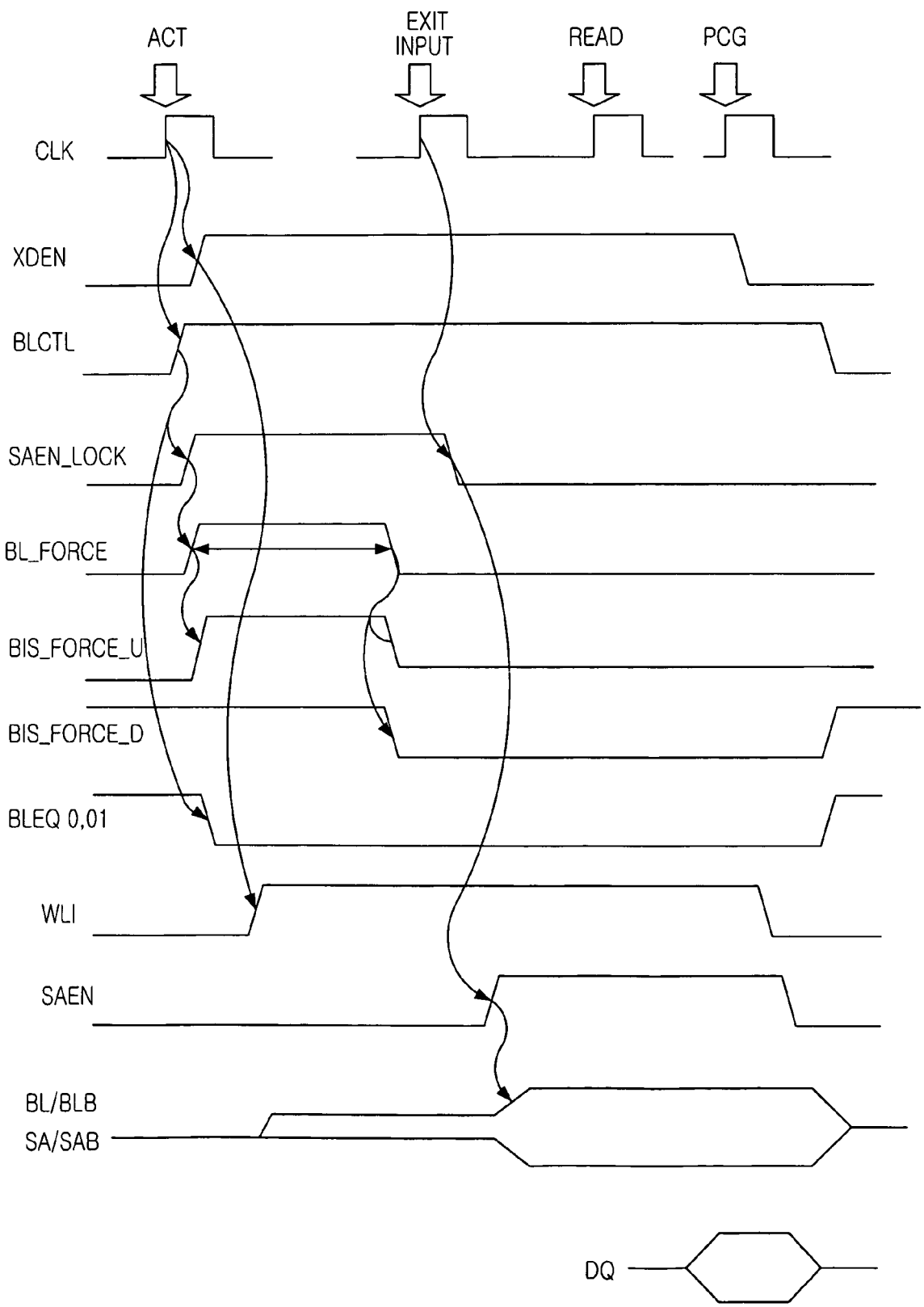
FIG. 12 is a signal timing diagram of the semiconductor memory device having the bit line sensing controller of FIG. 4E in accordance with the second embodiment of the present invention.

The bit line sensing controller 69 shown in FIG. 4E determines a turn-on period of the bit line select switch, which transfers a voltage of a power line to a bit line pair of the sense amplifier, by using an inverter delay. Then, an amplifying operation timing of the edge sense amplifier 22 is determined using a signal IN_EXT decoded with a specific combination of signals inputted in synchronization with a clock. Accordingly, if using the bit line sensing controller 69, an activation period of the sense amplifier enable signal SAEN can be determined arbitrarily. Here, the decoded signal IN_EXT may be a BST command applied from an exterior, or a combination of specific addresses. Also, the decoded signal may be a specific input signal (for example, an exit command). An operation timing of the bit line sensing controller 69 is shown in FIG. 12. Referring to FIG. 12, it can be seen that the sense amplifier lock signal saen_lock is controlled by an external signal exit command.

Figure 5:
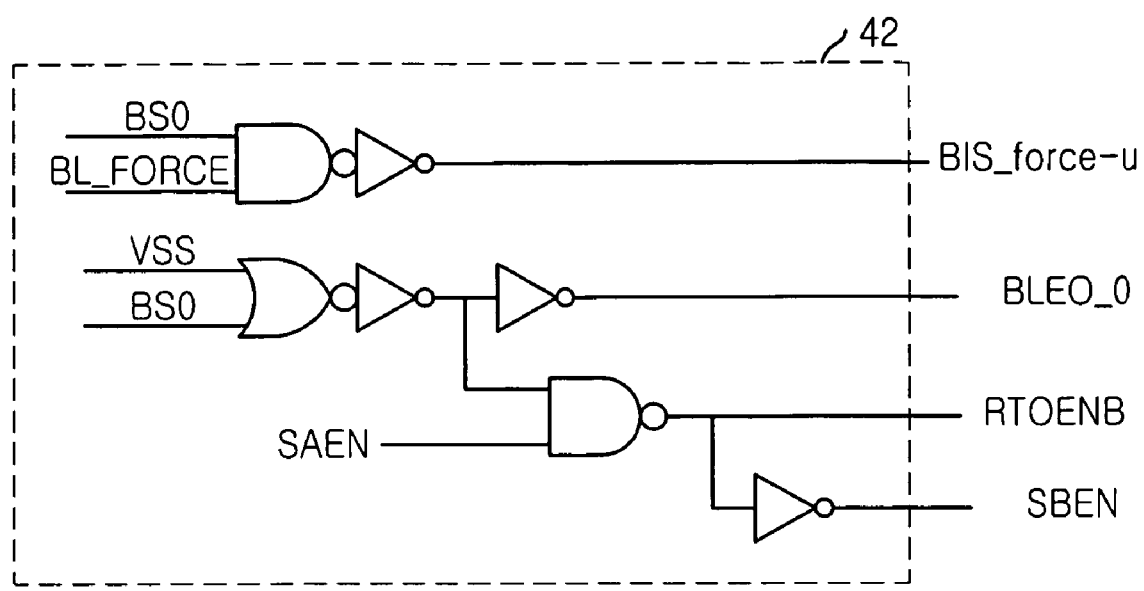
FIG. 5 is a circuit diagram illustrating an edge bit line sense amplifier controller of the semiconductor memory device in accordance with the first embodiment of the present invention.

The edge sense amplifier controller 42 shown in FIG. 5 controls the bit line select switches of the respective sense amplifiers of the edge sense amplifier array to connect the first power line and the second power line to the respective sense amplifiers. The edge sense amplifier controller 42 is a partial module of the X-decoder/amplifier controller 40 shown in FIG. 2. The sense amplifier controller 42 receives a cell array select signal BS0 and a bit line force signal BL_FORCE to generate a turn-on signal BIS_force_U of the first and second power supply switches and also receives the cell array select signal BS0 and the sense amplifier enable signal SAEN to generate a bit line precharge signal BLEQ and driving signals ROTENB and SBEN of the bit line sense amplifier.

If the bit line force signal BL_FORCE inputted to the edge sense amplifier controller 42 is high and the cell array select signal BS0 is high, the turn-on signal BIS_force_U of the first and second power supply switches becomes a high level, so that the bit line select switches are turned on. Thus, the voltage (offset test voltage) of the power line are transferred to an output line pairs of the respective edge sense amplifiers. Thereafter, if the bit line force signal BL_FORCE is set to a low level, the sense amplifier enable signal SAEN is activated in synchronization with the bit line force signal BL_FORCE of the low level, so that the voltage difference in the output line pair of the sense amplifier is amplified. The amplified voltage is used to determine the data outputted to an exterior by the read command. In this manner, the offset voltage of the bit line sense amplifier can be measured.

EMBODIMENT 2

Figure 6:
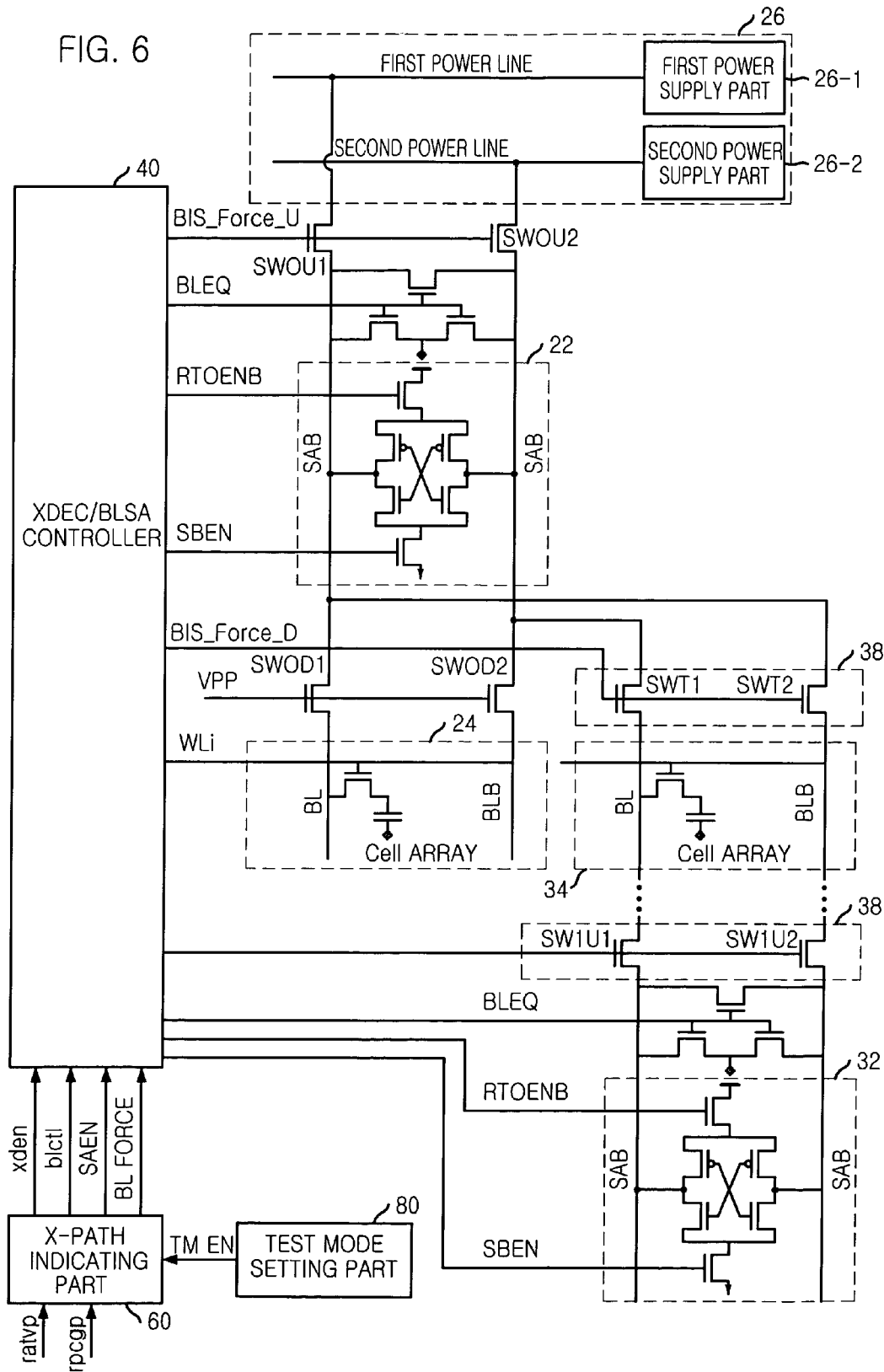
FIG. 6 is a circuit diagram illustrating a semiconductor memory device having an edge bit line sense amplifier and a semi-edge bit line sense amplifier of a semiconductor memory device in accordance with a second embodiment of the present invention.
Figure 7:
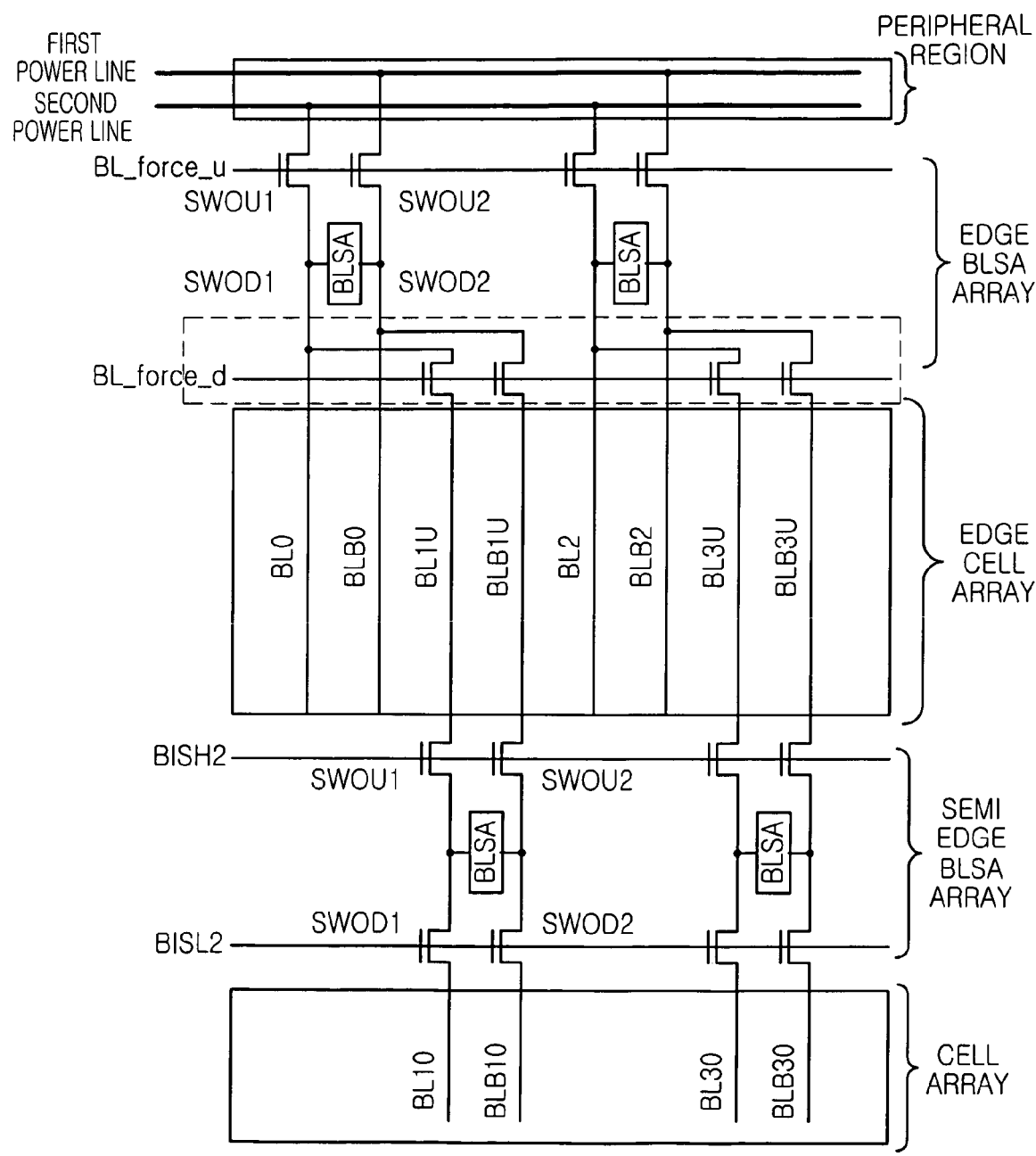
FIG. 7 is a diagram illustrating a BLSA array and a cell array of the semiconductor memory device in accordance with the second embodiment of the present invention.

FIGS. 6 and 7 are diagrams showing a structure of a semiconductor memory device in accordance with a second embodiment of the present invention. This embodiment is also applied to a DRAM having the shared sense amplifier structure.

Referring to FIGS. 6 and 7, the semiconductor memory device includes a plurality of cell arrays. An edge bit line sense amplifier 22 amplifies data of some cell columns 24 among edge cell arrays, and a semi-edge bit line sense amplifier 32 amplifies data of other cell columns 34 among the cell arrays. A power supply part 26 supplies a predetermined voltage to the edge bit line sense amplifier 22, and a power transfer unit 38 transfers the voltage to the semi-edge bit line sense amplifier 32.

The power supply part 26 includes a first power supply switch SWOU1 for supplying a voltage to a bit line of the edge bit line sense amplifier 32, and a second power supply switch SWOU2 for supplying a voltage to a complementary bit line of the edge bit line sense amplifier 22.

The power transfer unit 38 includes bit line select switches SW1U1 and SW1U2 for connecting the semi-edge bit line sense amplifier 32 to bit line pair of the cell column 34 managed by the semi-edge bit line sense amplifier 32, and power transfer switches SWT1 and SWT2 for connecting the edge bit line sense amplifier 22 to bit line pair of the cell column 34 managed by the semi-edge bit line sense amplifier 32.

In addition, the semiconductor memory device includes an X-decoder/amplifier controller 40 for selecting a cell and controlling a sense amplifier array, and a test mode setting part 80 for outputting a test mode enable signal TM_EN to represent an offset voltage test mode of the sense amplifier. The semiconductor memory device may further include an X-path indicating part 60 for generating a reference signal for an operation of the X-decoder/amplifier controller 40.

In this embodiment, since the DRAM has the shared sense amplifier structure, data of cell columns disposed at even rows (or odd rows) are amplified by the edge sense amplifier, and data of cell columns disposed at odd rows (or even rows) are amplified by a sense amplifier (semi-edge cell array) disposed next to the edge cell array.

Like the general bit line sense amplifier, upper bit line select switches SWOU1 and SWOU2 are connected to the upper bit line pair and lower bit line select signal switches SWOD1 and SWOD2 are connected to the lower bit line pair. In this embodiment, the edge bit line sense amplifier 32 is connected to the lower cell column through the lower bit line select switches SWOD1 and SWOD2 and is connected to the power supply part 26 through the upper bit line select switches SWOU1 and SWOU2 (therefore, the switches are referred to as power supply switches). Further, one terminal of each power transfer switch SWT1 and SWT2 is connected to locations where the lower bit line switches SWOD1 and SWOD2 are connected.

The semi-edge sense amplifier 32 is connected to the upper bit line pair through the bit line select switches SW1U1 and SW1U2. Since the upper bit line pair of the semi-edge sense amplifier 32 are connected to the other terminals of the power transfer switches SWT1 and SWT2, the test voltage supplied from the power supply part 26 is supplied to the semi-edge sense amplifier 32 through the power supply switches SWOU1 and SWOU2, the output line pair of the edge bit line sense amplifier 22, the power transfer switches SWT1 and SWT2, the upper bit line pair of the semi-edge sense amplifier 32, and the bit line select switches SW1U1 and SW1U2 connected to the semi-edge sense amplifier 32.

The first power supply part 26-1 and the second power supply part 26-2 can be separately implemented with a test voltage generator within the DRAM. Also, it is preferable that the test voltage is separately supplied from an exterior of the DRAM and then the sense amplifier offset test is performed. For theses reasons, it is preferable that the first power supply part 26-1 and the second power supply part 26-2 are implemented with external connection pads for merely receiving the voltage from the external of the DRAM.

Referring to FIGS. 4A to 4C, the X-path indicating part 60 includes a timing controller 62, an X-decoder enable signal generator 64, and a block control signal generator 66.

The timing controller 62 determines an activation timing of signals so as to secure a stable amplification operation of the cell. The X-decoder enable signal generator 64 generates a X-decoder enable signal XDEN for controlling an activation timing of the X-decoder. The block control signal generator 66 generates a block control signal blctl for controlling an activation timing of a corresponding cell array block.

In addition, like the first embodiment, the X-path indicating part 60 may further include bit line sensing controllers 68 and 69 shown in FIG. 4D or 4E. However, a turn-on signal $BIS_{13}force_{13}D$ of the power transfer switch is further included as an output signal.

FIG. 13 is a timing diagram of signals when the bit line sensing controllers 68 and 69 are implemented with the circuit of FIG. 4D, and FIG. 14 is a timing diagram of signals when the bit line sensing controllers 68 and 69 are implemented with the circuit of FIG. 4E.

Figure 8A:
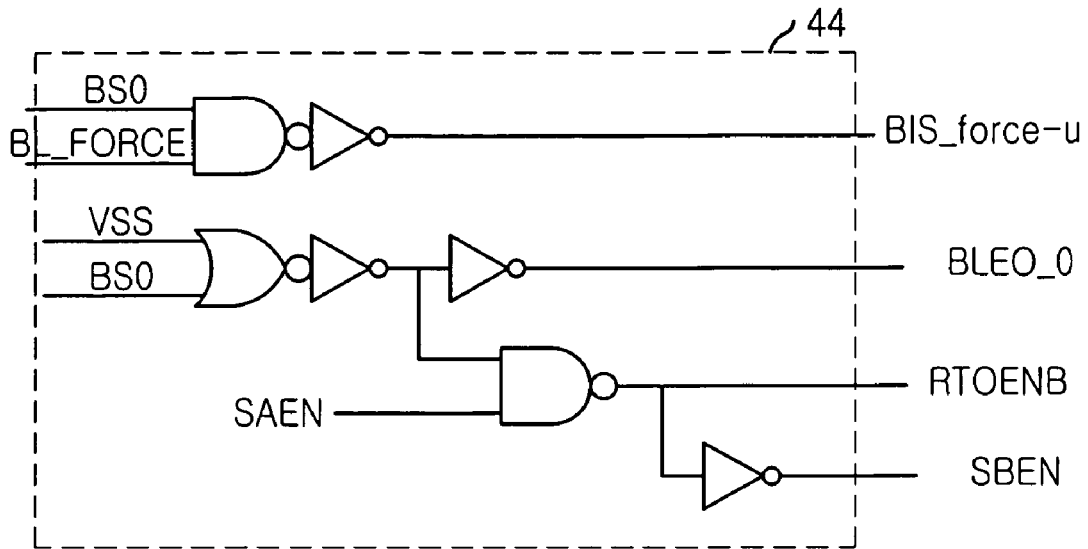
FIG. 8A is a circuit diagram illustrating an edge bit line sense amplifier controller of the semiconductor memory device in accordance with the second embodiment of the present invention.

The edge sense amplifier controller 44 shown in FIG. 8A controls the bit line select switches SWOU1, SWOU2, SWOD1 and SWOD2 of the respective sense amplifier 22 of the edge sense amplifier array to connect the first power line and the second power line. The edge sense amplifier controller 44 is a partial module of the X-decoder/amplifier controller 40. The edge sense amplifier controller 44 receives the cell array select signal BS0 and the bit line force signal $BL_{13}FORCE$ to generate the turn-on signal $BIS_{13}force_{13}U$ of the first and second power supply switches and the turn-on signal $BIS_{13}force_{13}D$ of the power transfer switch, and also receives the cell array select signal BS0 and the sense amplifier enable signal SAEN to generate the sense amplifier driving signals ROTENB and SBEN and the bit line precharge signal BLEQ.

Figure 8B:
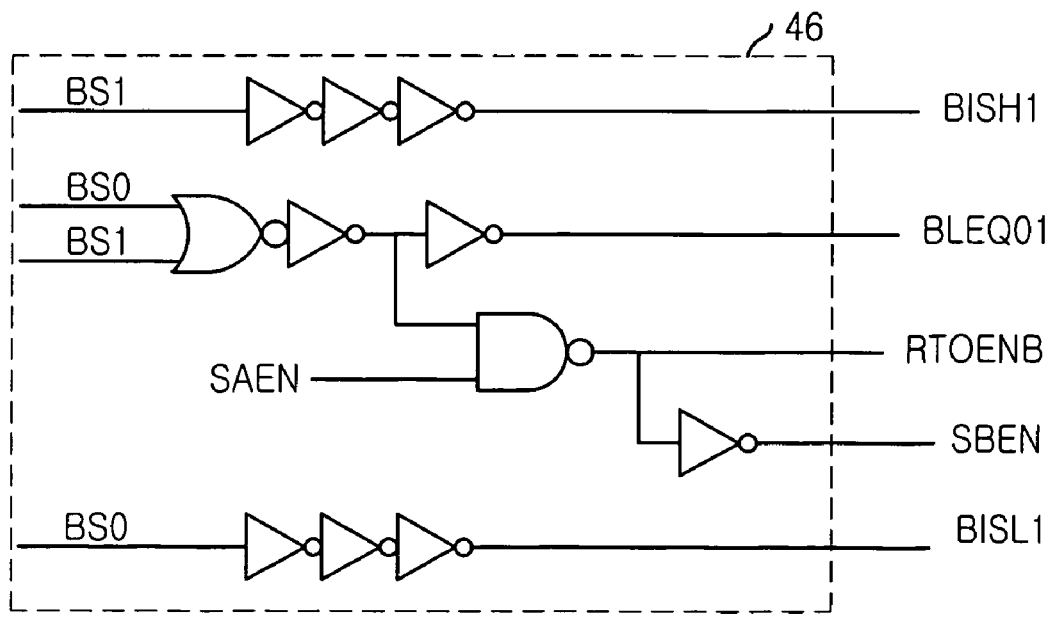
FIG. 8B is a circuit diagram illustrating a semi-edge bit line sense amplifier controller of the semiconductor memory device in accordance with the second embodiment of the present invention.
Figure 9:
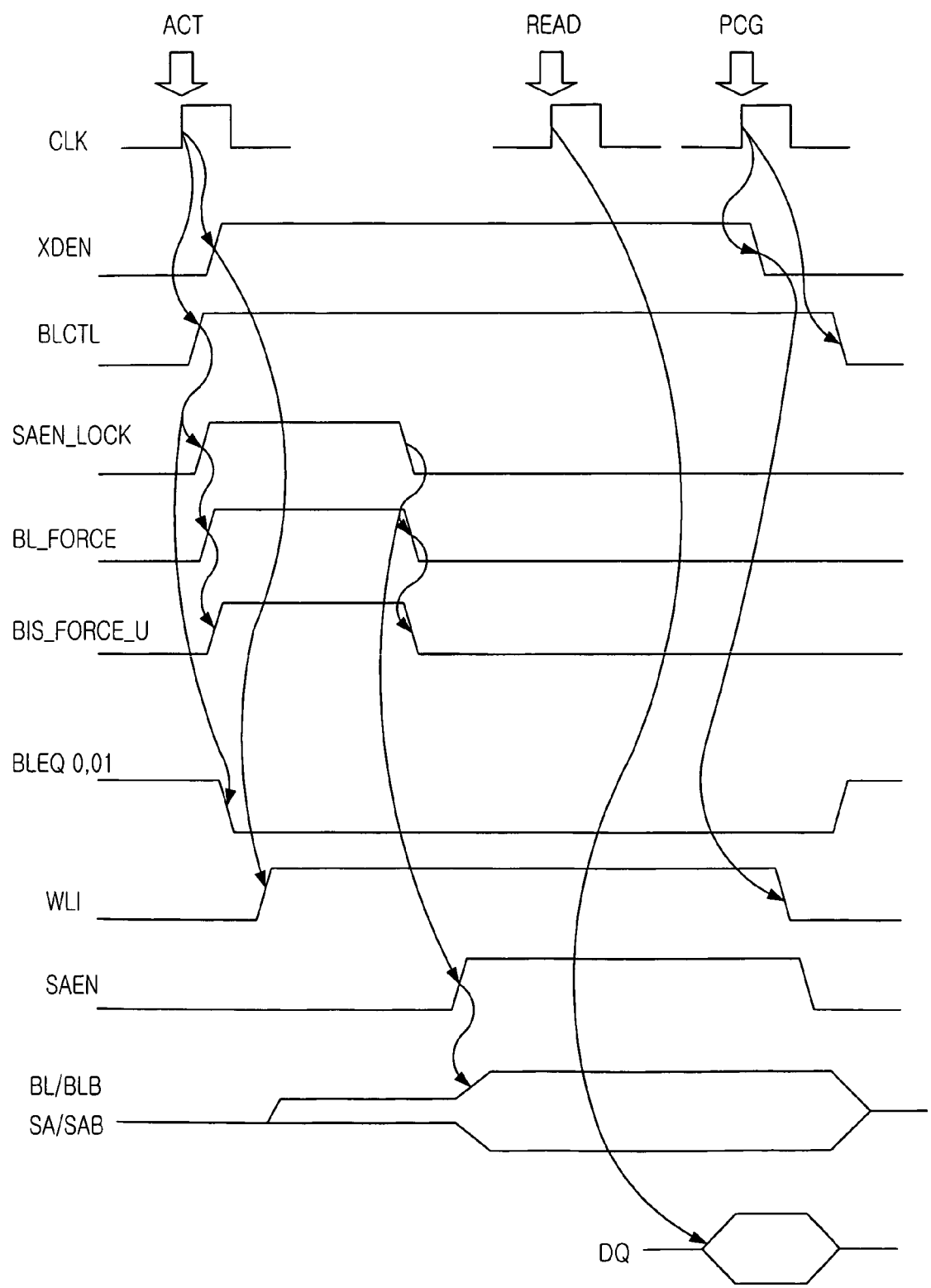
FIG. 9 is a signal timing diagram of the semiconductor memory device having the bit line sensing controller of FIG. 4D in accordance with the first embodiment of the present invention.

The semi-edge sense amplifier controller 46 shown in FIG. 8B controls the bit line select switches of the respective sense amplifier 32 of the semi-edge sense amplifier array. The semi-edge sense amplifier controller 46 is also a partial module of the X-decoder/amplifier controller 40. It has the same structure as the sense amplifier controller. However, the semi-edge sense amplifier controller 46 generates the cell array select signal BS0 to make the bit line select signal B1SH1 have a high level in the test mode.

If the bit line force signal $BL_{13}FORCE$ inputted to the edge sense amplifier controller is high and the cell array select signal BS0 is high, the turn-on signal $BIS_{13}force_{13}U$ of the power supply switch is set to a high level. Therefore, the power supply switches SWOU1 and SWOU2 is turned on to transfer the voltage (offset test voltage) of the power line to the output line pair SA and SAB of the edge sense amplifier 22. In order to supply the test voltage to all the bit line sense amplifiers managing the edge cell array, the turn-on signal $BIS_{13}force_{13}D$ of the power transfer switch is set to a high level together with the turn-on signal $BIS_{13}force_{13}U$ of the power supply switch. Thus, the power transfer switches SWT1 and SWT2 and the bit line select switches SW1U1 and SW1U2 connected to the semi-edge sense amplifier 22 are also turned on, while the lower bit line select switches are turned off. As a result, the test voltage is supplied to all the bit line sense amplifiers connected to the edge cell array. Thereafter, if the bit line force signal $BL_{13}FORCE$ is set to a low level, the sense amplifier enable signal SAEN is activated in synchronization with the bit line force signal $BL_{13}FORCE$ of the low level and then the voltage difference of the bit lines are amplified. The amplified voltage is used to determine the data outputted to an exterior by the read command. In this manner, the offset voltage of the bit line sense amplifier can be measured.

EMBODIMENT 3

In this embodiment, under the same structure of FIG. 2 in accordance with the first embodiment of the present invention, a new bit line sense amplifier including the first power supply part 26-1, the second power supply part 26-2, the first power supply switch SWOU1 and the second power supply switch SWOU2 can be defined. Since a detailed operation is equal to that of the first embodiment, a description thereof will be omitted.

EMBODIMENT 4

In this embodiment, under the same structure of FIG. 6 in accordance with the second embodiment of the present invention, a new bit line sense amplifier including the first power supply part 26-1, the second power supply part 26-2, the first power supply switch SWOU1, the second power supply switch SWOU2, a first power transfer switch SW1 and the second power transfer switch SW2 can be defined. Since a detailed operation is equal to that of the first embodiment, a description thereof will be omitted.

In accordance with the present invention, the amplification is determined by directly applying the test voltage to the bit line sense amplifier, not by using the estimated value, so that the offset voltage of the bit line sense amplifier can be measured more accurately.

In addition, the bit lines or the input/output lines can be disconnected when the test voltage is applied. Therefore, the offset voltage of the bit line sense amplifier can be measured.

The present application contains subject matter related to Korean patent application No. 2004-58865, filed in the Korean Patent Office on Jul. 27, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A bit line sense amplifying block for amplifying a voltage difference between a bit line and a complementary bit line on which data of a memory cell is applied in a data read operation, the bit line sense amplifier comprising:
    a first power supply part for generating a first offset test voltage to be applied to the bit line during a test mode;
    a second power supply part for generating, a second offset test voltage to be applied to the complementary bit line during the test mode;
    a first power supply switch for selectively connecting the first power supply part to the bit line;
    a second power supply switch for selectively connecting the second power supply part to the complementary bit line; and
    a bit line sense amplifier for amplifying a difference between the first and second offset test voltages during the test mode to thereby output the amplified difference as a reference for measuring an offset voltage of the bit line sense amplifier.

2. The bit line sense amplifying block as recited in claim 1, wherein the bit line sense amplifier is disposed at an edge of a memory cell array block.

3. The bit line sense amplifying block as recited in claim 1, further comprising:
    a first voltage transfer switch for selectively transferring the first voltage to another bit line connected to another bit line sense amplifier; and
    a second voltage transfer switch for selectively transferring the second voltage to a complementary bit line of the another bit line connected to the another bit line sense amplifier,
    wherein the first and second voltage transfer switches are formed with MOS transistors.

4. A semiconductor memory device, comprising:
    a cell array;
    an edge bit line sense amplifier for either amplifying data of an edge cell array or amplifying a difference between predetermined offset test voltages to thereby output an amplified voltage as a reference for measuring an offset voltage of the edge bit line sense amplifier;
    a power supply part including a connection pad receiving a predetermined offset test voltages supplied from an exterior of the semiconductor memory device and applying the predetermined offset test voltages to the edge bit line sense amplifier during a test mode;
    an X-decoder/amplifier controlling part for selecting a cell and controlling the sense amplifier array; and
    an X-path indicating part for generating a reference signal for an operation of the X-decoder/amplifier controlling part.

5. The semiconductor memory device as recited in claim 4, wherein the power supply part includes:
    a first power supply part for supplying a first predetermined voltage of the predetermined offset test voltages to a bit line of the edge bit line sense amplifier; and
    a second power supply part for supplying a second predetermined voltage of the predetermined offset test voltages to a complementary bit line of the edge bit line sense amplifier.

6. The semiconductor memory device as recited in claim 5, further comprising:
    a first power supply switch for connecting a bit line of the edge bit line sense amplifier to the first power supply part; and
    a second power supply switch for connecting a complementary bit line of the edge bit line sense amplifier to the second power supply part.

7. The semiconductor memory device as recited in claim 5, wherein the first power supply part is a first connection pad for receiving the first predetermined voltage, and the second power supply part is a second connection pad for receiving the first predetermined voltage.

8. The semiconductor memory device as recited in claim 6, further comprising a test mode setting part for outputting a test mode enable signal for an offset voltage measurement mode of the edge bit line sense amplifier.

9. The semiconductor memory device as recited in claim 4, wherein the X-path indicating part includes:
    an X-decoder enable signal generator for generating an X-decoder enable signal for controlling an activation timing of an X decoder;
    a block control signal generator for generating a block control signal for controlling an activation timing of a corresponding cell array block; and
    a bit line sensing controller for controlling a switching operation of the first and second power supply switches and an amplifying operation of the sense amplifier, so that a voltage is supplied to the edge bit line sense amplifier through a power line.

10. The semiconductor memory device as recited in claim 9, wherein the bit line sensing controller includes:
    a command processing module for receiving an active/precharge command for the sense amplifier to generate a sense amplifier enable signal; and
    a test processing module for deactivating the command processing module in a test mode and generating a block force signal enabled for a predetermined time.

11. A semiconductor memory device comprising:
    a cell array;
    an edge bit line sense amplifier for either amplifying data of some cell columns among edge cell arrays or amplifying a difference between predetermined offset test voltages to thereby output a first amplified voltage as a first reference for measuring an offset voltage of the edge bit line sense amplifier;
    a semi-edge bit line sense amplifier for either amplifying data of other cell columns among the edge cell arrays or amplifying the difference between the predetermined offset test voltages to thereby output a second amplified voltage as a second reference for measuring an offset voltage of the semi-edge bit line sense amplifier;

a power supply part including a connection pad receiving a predetermined offset test voltages supplied from an exterior of the semiconductor memory device and supplying the predetermined offset test voltages to the edge bit line sense amplifier during a test mode; and a voltage transfer part for selectively transferring the voltage to the semi-edge bit line sense amplifier.

12. The semiconductor memory device as recited in claim 11, wherein the power supply part includes:

a first power supply part for supplying a first voltage of the predetermined offset test voltages to a bit line of the edge bit line sense amplifier; and a second power supply part for supplying a second voltage of the predetermined offset test voltages to a complementary bit line of the edge bit line sense amplifier.

13. The semiconductor memory device as recited in claim 12, further comprising:

a first power supply switch for connecting a bit line of the edge bit line sense amplifier to the first power supply part; and a second power supply switch for connecting a complementary bit line of the edge bit line sense amplifier to the second power supply part.

14. The semiconductor memory device as recited in claim 12, wherein the first power supply part is a first connection pad for receiving the first predetermined voltage, and the second power supply part is a second connection pad for receiving the second predetermined voltage.

15. The semiconductor memory device as recited in claim 11, wherein the voltage transfer part includes:

a first voltage transfer switch for selectively connecting a bit line of the semi-edge bit line sense amplifier to a bit line of the edge bit line sense amplifier; and a second voltage transfer switch for selectively connecting a complementary bit line of the semi-edge bit line sense amplifier to a complementary bit line of the edge bit line sense amplifier.

16. The semiconductor memory device as recited in claim 13, further comprising a test mode setting part for outputting a test mode enable signal for an offset voltage measurement mode of the sense amplifier.

17. The semiconductor memory device as recited in claim 13, further comprising:

an X-decoder/amplifier controlling part for selecting a cell and controlling the sense amplifier array; and an X-path indicating part for generating a reference signal for an operation of the X-decoder/amplifier controlling part.

18. The semiconductor memory device as recited in claim 17, wherein the X-path indicating part includes:

an X-decoder enable signal generator for generating an X-decoder enable signal for controlling an activation timing of an X decoder;

a block control signal generator for generating a block control signal for controlling an activation timing of a corresponding cell array block; and a bit line sensing controller for controlling a switching operation of the first and second power supply switches and an amplifying operation of the sense amplifier, so that a voltage is supplied to the edge bit line sense amplifier through a power line.

19. The semiconductor memory device as recited in claim 18, wherein the bit line sensing controller includes:

a command processing module for receiving an active/precharge command for the sense amplifier to generate a sense amplifier enable signal; and a test processing module for deactivating the command processing module in a test mode and generating a block force signal enabled for a predetermined time.

* * * * *